(12) United States Patent
Lo et al.

(10) Patent No.: US 6,311,765 B1
(45) Date of Patent: Nov. 6, 2001

(54) HEAT SINK ASSEMBLY

(75) Inventors: Wei-Ta Lo, Tu-Chen; Chung-Yung Sun, Kee-Lung; Chao-Yang Lee, Taipei, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/632,368

(22) Filed: Aug. 3, 2000

(30) Foreign Application Priority Data

Mar. 31, 2000 (TW) .................................................. 89205289

(51) Int. Cl.⁷ ....................................................... H05K 7/20
(52) U.S. Cl. .......................... 165/80.3; 361/704; 257/719
(58) Field of Search .................................. 165/80.3, 185; 361/704, 710, 712, 713, 719, 722; 174/16.3; 257/719, 722

(56) References Cited

U.S. PATENT DOCUMENTS

| | | | | |
|---|---|---|---|---|
| 5,570,271 | * | 10/1996 | Lavochkin | 361/704 |
| 5,889,653 | * | 3/1999 | Clemens et al. | 361/704 |
| 5,943,210 | * | 8/1998 | Lee et al. | 361/697 |
| 6,025,994 | * | 2/2000 | Chiou | 361/715 |

* cited by examiner

*Primary Examiner*—Allen Flanigan
(74) *Attorney, Agent, or Firm*—Wei Te Chung

(57) ABSTRACT

A heat sink assembly includes a heat sink, a clip and a fastener. The heat sink includes a base and a plurality of fins extending upwardly from the base. A slot is defined between the fins. Grooves are defined on opposite sides of a particular row of the fins. The clip defines a spring portion received in the slot of the heat sink. The curved fastener forms a pair of projections with a gap defined therebetween extending inwardly from both ends of the fastener for engaging the corresponding grooves of the heat sink. A tab is defined on one side of the fastener for engagement with an edge of one of the fins.

10 Claims, 4 Drawing Sheets

HEAT SINK ASSEMBLY

BACKGROUND OF THE INVENTION

1. Field of the Invention

The present invention relates to a heat sink assembly, and particularly to a heat sink assembly having a fastener eliminating relative movement between a clip and a heat sink. The copending application Ser. No. 09/611,875 filed Jul. 7, 2000 is related hereto.

2. The Related Art

Many electronic devices, such as a central processing unit (CPU), operate in a limited temperature range and usually become unstable when their temperature is outside that range. On the other hand, the electronic devices generate a great amount of heat during operation. To maintain operation temperature within the proper range, a heat sink is often used to remove heat from the electronic devices.

A conventional heat sink 1, as shown in FIG. 3 of the attached drawings, is attached to a CPU 3 by a clip 2. A spring portion 5 of the clip 2 presses the heat sink 1 onto the CPU 3, with a pair of legs 6 engaging with a socket 4 on which the CPU 3 is mounted. However, the clip 2 is readily detached from the heat sink 1 due to undesired disengagement between the clip 2 and the heat sink 5 when a force is exerted on the clip 2 or the heat sink 1.

To meet the trend toward miniaturization in the computer industry, a flip chip package is broadly used. Referring to FIG. 4, a flip chip package comprises a substrate 6 and a flip chip 3 formed in the substrate 6. A conventional clip 2 is used to attach the heat sink 1 to the flip chip 3. However, the heat sink 1 is readily rotated about a die edge of the flip chip 3. Thus, the heat sink 1 cannot be fully in contact with the flip chip 3, which lessens the efficiency of removing heat from the flip chip 3.

It is strongly desired to provide a heat sink assembly which overcomes the above problems encountered in the prior art.

SUMMARY OF THE INVENTION

Accordingly, an object of the present invention is to provide a heat sink assembly comprising a fastener for securely attaching a heat sink to an electronic device.

To achieve the mentioned object, a heat sink assembly in accordance with the present invention includes a heat sink, a clip and a fastener. The heat sink comprises a base and a plurality of fins extending upwardly from the base. A slot is defined between the fins. Grooves are defined on opposite sides of a particular row of fins. The clip comprises a spring portion for extending along the slot of the heat sink and a pair of legs extending from opposite ends of the spring portion. The curved fastener comprises a pair of projections extending inwardly from both ends thereof with a gap defined between the projections for engaging the corresponding grooves of the heat sink to retain the clip in the heat sink. A tab is defined on one side of the fastener for engagement with an edge of one of the fins.

Other objects, advantages and novel features of the present invention will be drawn from the following detailed description of a preferred embodiment of the present invention with reference to the attached drawings, in which:

DESCRIPTION OF THE PREFERRED EMBODIMENT

Figure 1:
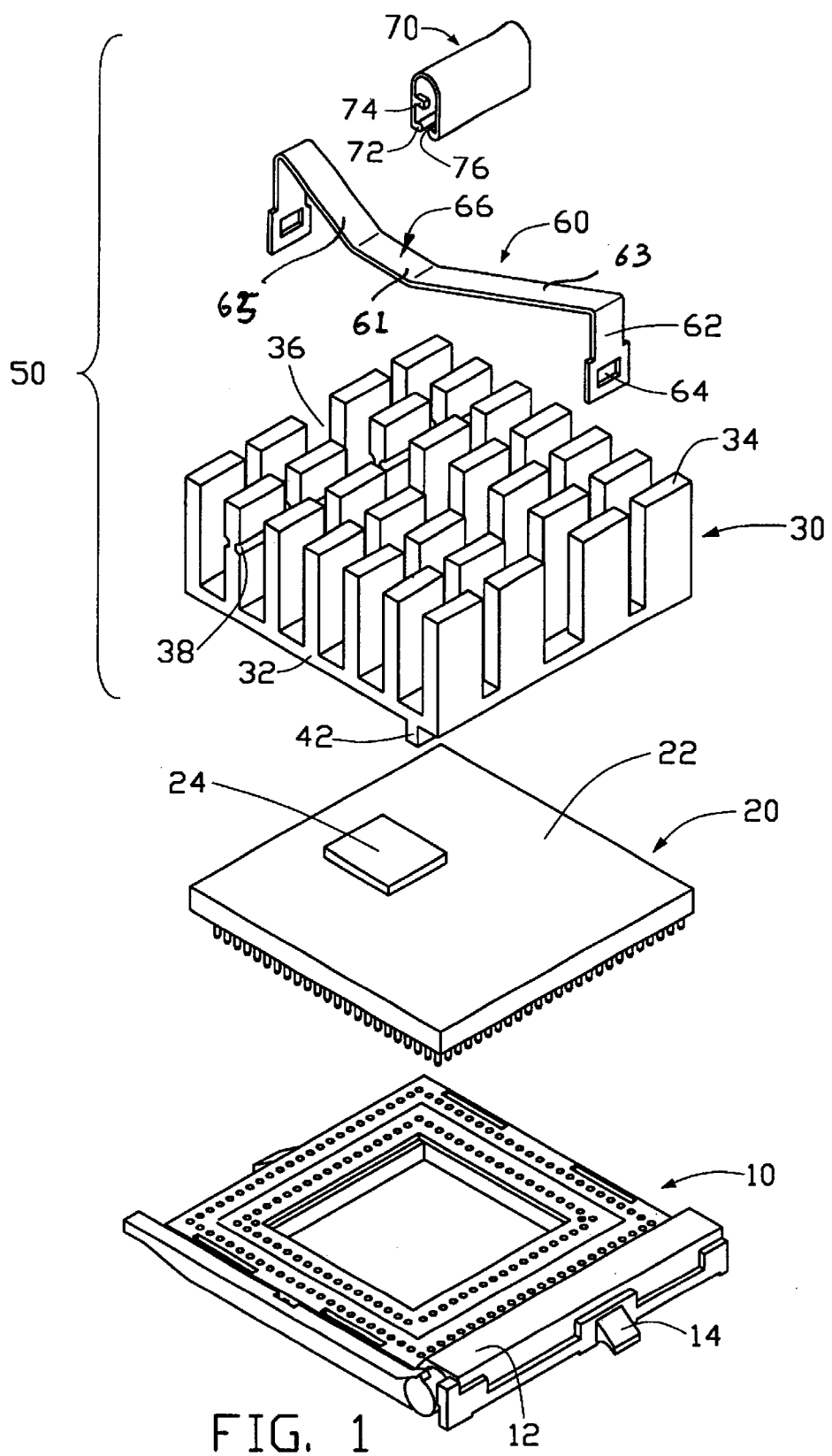
FIG. 1 is an explode view of a heat sink assembly constructed in accordance with the present invention.

Referring to the attached drawings, FIG. 1 shows a heat sink assembly 50 of the present invention for mounting to an integrated circuit module, such as a central processing unit (CPU) 20 including a substrate with an non-centered flip chip 24 thereon, retained on a socket connector 10 which has a pair of latches 14 on opposite sides thereof. The heat sink assembly 50 comprises a heat sink 30, a clip 60 and a fastener 70.

The heat sink 30 comprises a base 32 having a bottom face and an opposite top face and a plurality of fins 34 extending upward from the top face of the base 32. A slot 36 is defined between the fins 34 for receiving the clip 60. A pair of grooves 38 is defined in opposite sides of a particular row of the fins 34. An elongate protrusion 42 extends from the bottom face of the base 32. The clip 60 comprises an elongate spring portion 66 received in and extending along the slot 36 of the heat sink 30 and a pair of legs 62 extending from opposite ends of the spring portion 66. The spring portion 66 includes a horizontal middle portion 61, a shorter slanted portion 65 and a longer slanted portion 63 respectively connected between the horizontal middle portion 61 and the respective legs 62. Each leg 62 defines an aperture 64 for engaging with the corresponding latch 14 of the socket 10.

The fastener 70, which may be constructed from a metallic or from a plastic material, is bent in a U-shape. A pair of opposite projections 72 with a gap 76 defined therebetween extend inwardly from distal ends of the fastener 70 for engaging the corresponding grooves 38 of the heat sink 30. A tab 74 extends inwardly from one side of the fastener 70 for engagement with one edge of one of the fins 34 for preventing movement of the fastener 70 in a direction along the grooves 38.

Figure 2:
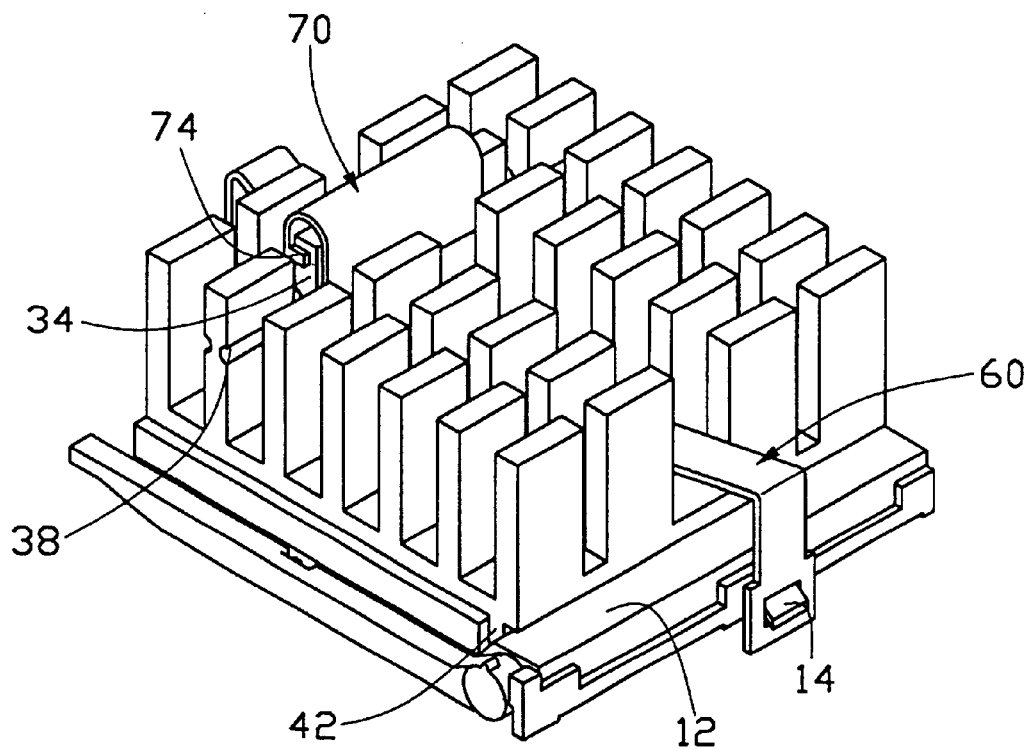
FIG. 2 is an assembled view of FIG. 1.
Figure 3:
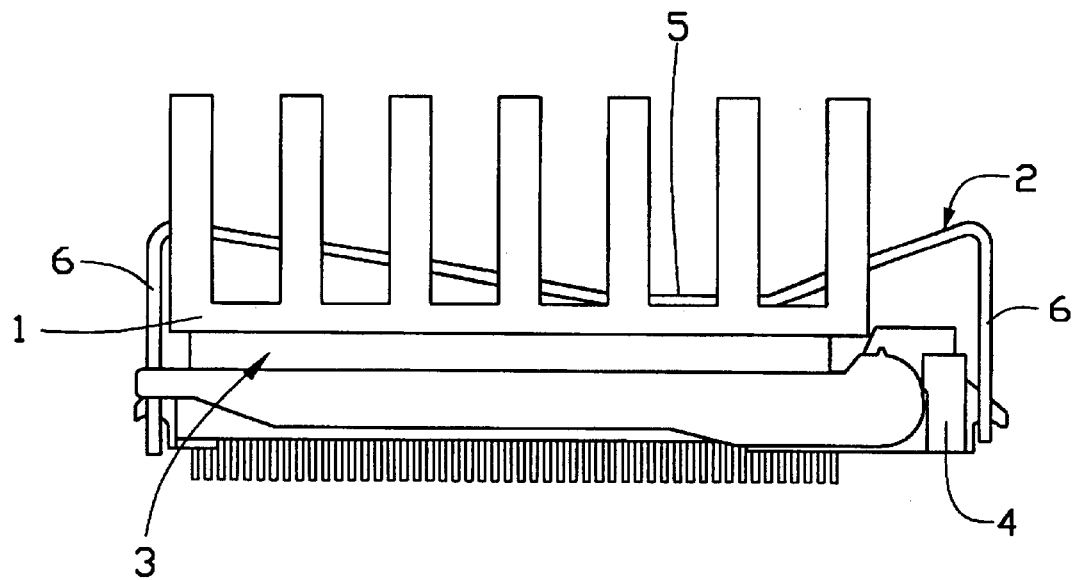
FIG. 3 is a side view of a conventional heat sink assembly.
Figure 4:
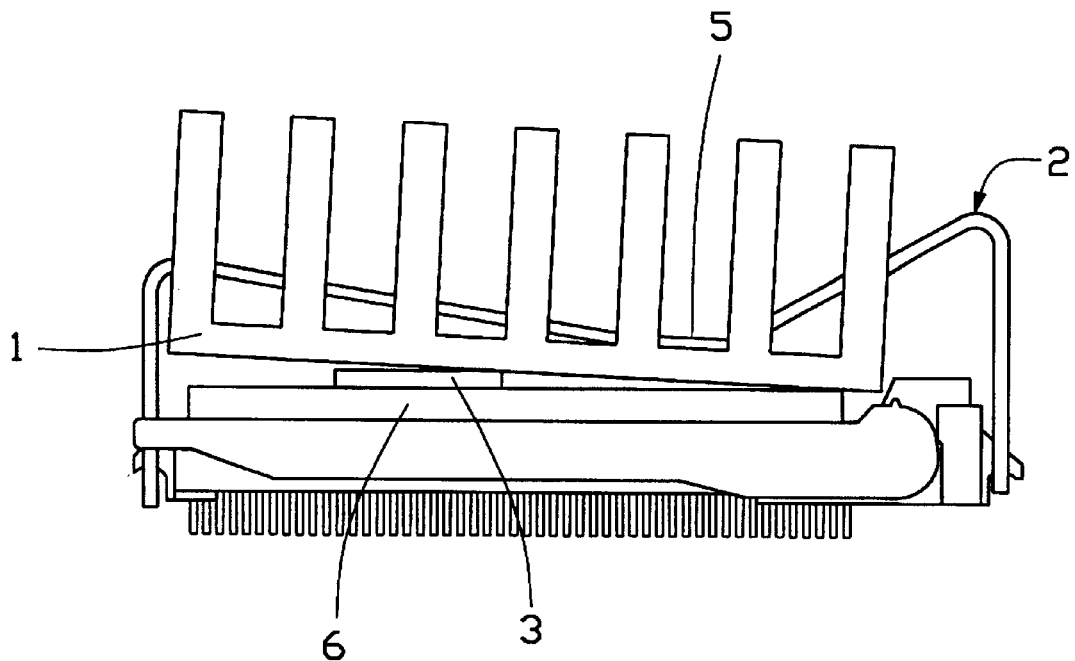
FIG. 4 is similar to FIG. 3 but showing a heat sink attached to a flip chip package.

Referring to FIG. 2, in assembly, the clip 60 is received in the slot 36 of the heat sink 30 and elastically presses the heat sink 30 to the CPU 20 with the apertures 64 thereof engaging the latches 14 of the socket connector 10. The protrusion 42 of the heat sink 30 is received between an edge of a substrate 22 of the CPU 20 and a raised portion 12 of the socket connector 10. The fastener 70 is snapped into the grooves 38 above the clip 60 and is elastically deformed to allow the fins 34 to extend through the gap 76 so as to have the projections 72 engaging the grooves 38 of the fins 34. A tab 74 engages with an edge of a fin 34 for preventing the fastener 70 from slipping along the grooves 38 of the heat sink 30 relative to the fins 34. Thus, the fastener 70 is securely fixed to the heat sink 30. The opposite ends of the fastener 70 engage with the clip 60 whereby the clip 60 is securely attached to the heat sink 30 and relative movement therebetween is effectively eliminated.

It is understood that the invention may be embodied in other forms without departing from the spirit thereof. Thus, the present example and embodiment is to be considered in all respects as illustrative and not restrictive, and the invention is not to be limited to the details given herein.

We claim:

1. A heat sink assembly for mounting to an integrated circuit module retained on a socket connector comprising:

a heat sink having a base, a plurality of fins extending from the base and a slot being defined between the fins;

a clip received in the slot of the heat sink; and a discrete fastener engaging with at least one fin of the heat sink and abutting against the clip for securely attaching the clip to the heat sink.

2. The heat sink assembly as claimed in claim 1, wherein grooves are defined on opposite sides of one row of fins and a pair of opposite projections extend inwardly from the opposite ends of the fastener adapted to engage the corresponding grooves of the heat sink.

3. The heat sink assembly as claimed in claim 1, wherein a tab is defined on one side of the fastener for engagement with one edge of a fin.

4. An assembly comprising:

a socket including a pair of latches thereof;

an electronic device positioned on the socket with a flip chip positioned thereon relatively adjacent to one edge thereof;

a heat sink positioned on the flip chip, said heat sink including a base with a plurality of fins extending upwardly therefrom, a slot defined between the fins;

a clip including an elongated spring portion received within the slot, and two legs respectively downwardly extending proximate two opposite ends of the spring portion and locked with the corresponding latches; and a discrete fastener attached to some specific fins around the slot, and substantially blocking an upward movement of the clip thereunder.

5. The assembly as claimed in claim 4, wherein said fastener is generally positioned adjacent and above the flip chip.

6. The assembly as claimed in claim 4, wherein said spring portion of the clip includes a middle horizontal portion, a shorter slanted portion positioned between said middle horizontal portion and one corresponding leg, and a longer slanted portion positioned between said middle horizontal portion and the other leg.

7. The assembly as claimed in claim 6, wherein the fastener is closer to said shorter slanted portion than said longer slanted portion.

8. A heat sink assembly comprising:

a heat sink including a base with a plurality of fins extending upwardly therefrom, said fins defining a slot;

a clip positioned in the slot, said clip including an elongated spring portion with two legs downwardly extending proximate two ends thereof; and a fastener attached to the fins above the clip, and crossing the slot to block upward movement of the clip thereunder.

9. The heat sink assembly as claimed in claim 8, wherein said spring portion defines a middle horizontal position, a shorter slanted portion positioned between one leg and the horizontal portion, and a longer slanted portion positioned between the other leg and the horizontal portion.

10. The heat sink assembly as claimed in claim 9, wherein said fastener is positioned adjacent and above the middle horizontal portion of the clip.

* * * * *